(12) United States Patent
Estakhri et al.

(10) Patent No.: US 6,182,162 B1
(45) Date of Patent: Jan. 30, 2001

(54) EXTERNALLY COUPLED COMPACT FLASH MEMORY CARD THAT CONFIGURES ITSELF ONE OF A PLURALITY OF APPROPRIATE OPERATING PROTOCOL MODES OF A HOST COMPUTER

(75) Inventors: Petro Estakhri, Pleasonton; Mahmud Assar, Morgan Hill, both of CA (US)

(73) Assignee: Lexar Media, Inc., Fremont, CA (US)

( * ) Notice: Under 35 U.S.C. 154(b), the term of this patent shall be extended for 0 days.

(21) Appl. No.: 09/034,173

(22) Filed: Mar. 2, 1998

(51) Int. Cl.[7] .......................... G06F 13/00; G06F 13/374; G06F 13/42

(52) U.S. Cl. ................................ 710/11; 710/8; 710/10; 710/63

(58) Field of Search .................................. 710/8, 10, 14, 710/15, 104, 11, 126, 63; 365/51; 326/56; 395/831, 500

(56) References Cited

U.S. PATENT DOCUMENTS

| 4,701,841 | * | 10/1987 | Goodrich et al. | 710/126 |
| 5,361,005 | * | 11/1994 | Slattery et al. | 326/56 |
| 5,524,362 | * | 6/1996 | Quandt et al. | 34/526 |
| 5,594,874 | * | 1/1997 | Narayanan et al. | 710/104 |
| 5,630,170 | * | 5/1997 | Koizumi et al. | 710/12 |
| 5,754,890 | * | 5/1998 | Holmdahl et al. | 710/63 |
| 5,815,426 | * | 9/1998 | Jigour et al. | 365/51 |
| 5,881,252 | * | 3/1999 | Sahgal et al. | 710/104 |
| 5,920,197 | * | 7/1999 | Price et al. | 324/538 |
| 6,038,400 | * | 3/2000 | Bell et al. | 395/831 |

OTHER PUBLICATIONS

"Compact Flash Specification", Compact Flash Association, Revision 1.0, 1996.

* cited by examiner

*Primary Examiner*—Thomas C. Lee
*Assistant Examiner*—Tammara Peyton
(74) *Attorney, Agent, or Firm*—Haverstock & Owens LLP

(57) ABSTRACT

An improved compact flash memory card system includes an improved compact flash memory card desktop adapter and an improved compact flash memory card. The improved compact flash memory card desktop adapter utilizes a fifty pin socket to interface with the compact flash memory card. The desktop adapter also utilizes a plug adapter to interface with a computer. For more efficient communication between the improved compact flash memory card and the computer, the improved desktop adapter adopts the universal serial bus architecture. The improved compact flash memory card utilizes a fifty pin connection to interface with a computer through an interface device. The fifty pin connection of the flash memory card can be used with different interface devices in a variety of configurations such as a universal serial bus mode, PCMCIA mode, and ATA IDE mode. Each of these modes of operation require different protocols. Upon initialization with an interface device, this improved compact flash memory card automatically detects which operation mode is used by this interface device and configures the memory card to be compatible with the present operation mode. Because all fifty pins of the flash memory card are occupied to either transfer data or provide control signals to and from the flash memory card, this improved flash memory card merely senses selected pins to determine the present mode of operation.

14 Claims, 3 Drawing Sheets

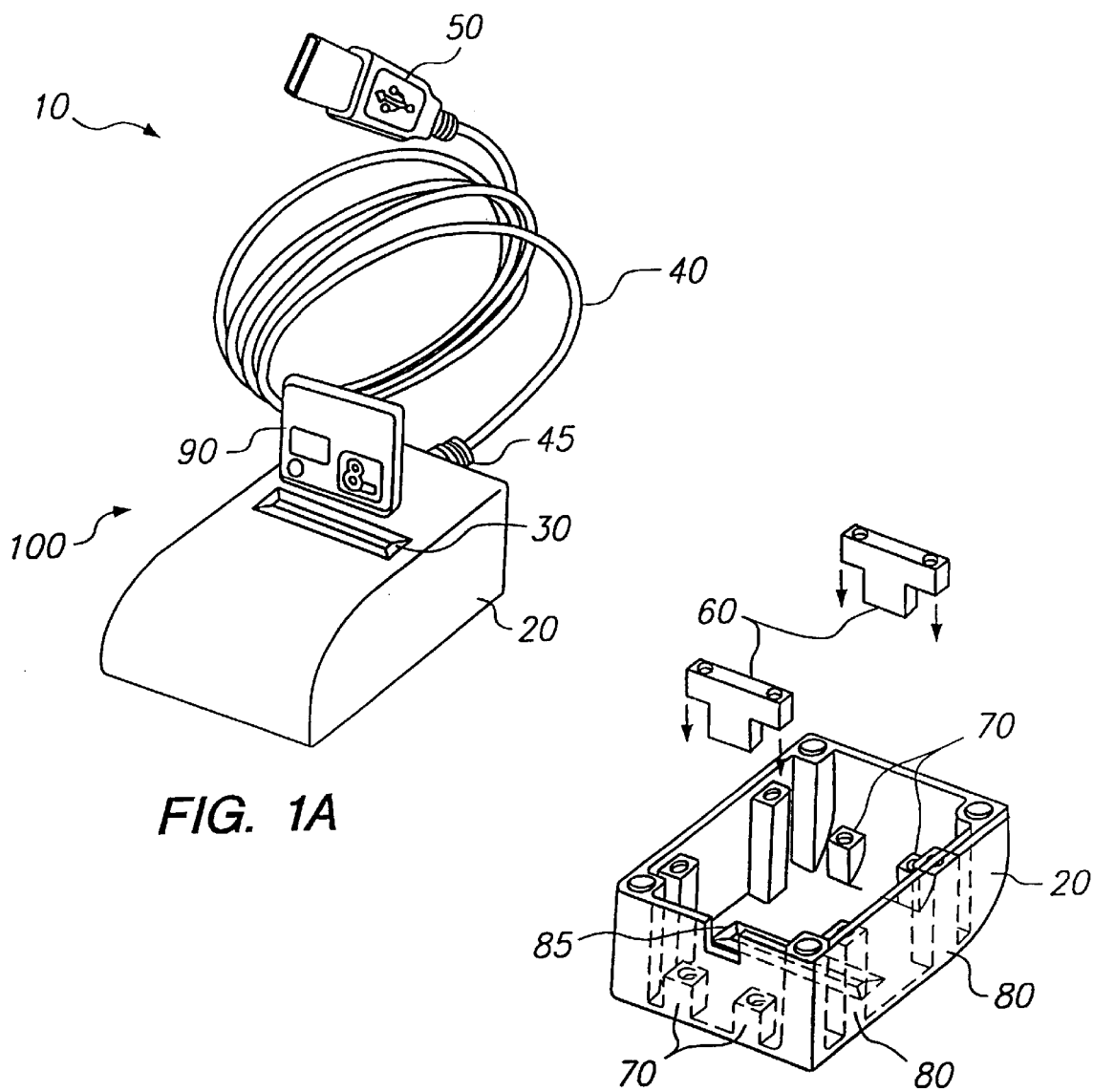
FIG. 1A
FIG. 1B
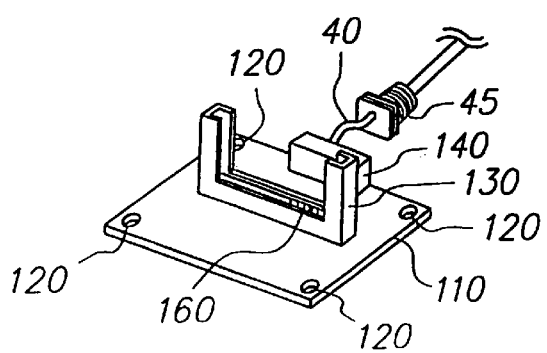
FIG. 1C

EXTERNALLY COUPLED COMPACT FLASH MEMORY CARD THAT CONFIGURES ITSELF ONE OF A PLURALITY OF APPROPRIATE OPERATING PROTOCOL MODES OF A HOST COMPUTER

FIELD OF THE INVENTION

This invention relates to the field of compact flash memory cards and compact flash memory card holders. More particularly, this invention relates to the field of compact flash memory cards that automatically select the appropriate operating mode. Further, this invention also more particularly relates to the field of universal serial bus adapters for connecting a flash memory card to a host computer.

BACKGROUND OF THE INVENTION

Today's personal computers have become increasingly powerful in terms of pure processing ability and their wide application of usefulness. There has been a proliferation of available external peripheral devices for use with a personal computer. In particular, flash memory cards that are removably coupled to personal computers are especially useful as portable, quick storage devices.

In the past, personal computers utilized serial buses and parallel buses as primary input/output interfaces to connect with external peripheral devices. These serial and parallel buses do not have the capability to allow the user to attach an external peripheral device to either type of bus on a personal computer and begin utilizing this peripheral device without properly configuring the computer and/or peripheral device. In other words, serial and parallel buses lack "plug and play" capabilities. Further, the existing serial and parallel buses are only optimized for only one or two peripheral devices attached to each bus.

To address the shortcomings of the serial and parallel buses, the universal serial bus architecture was introduced. The universal serial bus provides a fast bi-directional isochronous transfer of data between external peripheral devices and the computer at very low cost. Further, the universal serial bus is designed to support an unrestricted number of external peripheral devices connected to a single universal serial bus. The universal serial bus also supports "plug and play" capabilities for external peripheral devices.

One of the external peripheral devices which is well suited for use with the universal serial bus are compact flash memory cards. These compact flash memory cards provide "plug and play" capability, low power consumption, portability, and high density storage. Compact flash memory cards are well suited for digital applications such as digital camera storage, digital audio applications, and wherever rewritable, digital data storage in a portable housing is needed.

The interface portion of compact flash memory cards are uniformly configured as a fifty pin connection. The compact flash memory card with its fifty pin connection is designed to fit within either a fifty pin compact flash socket or a sixty-eight pin PCMCIA socket. However, most desktop computers do not have either the fifty pin compact flash socket or the sixty-eight pin PCMCIA socket. If a user wishes to utilize the compact flash memory device with the desktop computer, the user must purchase an expensive PCMCIA socket to connect with the desktop computer.

Another shortcoming is the inability of the compact flash memory card to be conveniently configured for operating in the universal serial bus mode, the PCMCIA mode, or the ATA IDE mode. It would be beneficial to have an adapter for a compact flash memory card that automatically configures itself to the appropriate operating mode depending upon the type of device to which the flash is connected.

What is needed is a low cost fifty pin compact flash socket interface adapter for a universal serial bus configuration to couple a compact flash memory card to a desktop computer. What is further needed is a compact flash memory card adapter that automatically detects the operating mode of the socket to which the compact flash socket interface adapter is coupled and configures the itself to the proper operating mode.

SUMMARY OF THE INVENTION

The present invention is an improved compact flash memory card system. The present invention overcomes many of the disadvantages of the prior art. This improved compact flash memory card system comprises: an improved compact flash memory card desktop adapter and an improved compact flash memory card.

The improved compact flash memory card desktop adapter utilizes a fifty pin socket to interface with the compact flash memory card. The desktop adapter also utilizes a plug adapter to interface with a computer. For more efficient communication between the improved compact flash memory card and the computer, the improved desktop adapter adopts the universal serial bus architecture.

The improved compact flash memory card utilizes a fifty pin connection to interface with a computer through an interface device. The fifty pin connection of the flash memory card can be used with different interface devices in a variety of configurations such as a universal serial bus mode, PCMCIA mode, and ATA IDE mode. Each of these modes of operation require different protocols. Upon initialization with an interface device, this improved compact flash memory card automatically detects which operation mode is used by this interface device and configures the memory card to be compatible with the present operation mode. Because all fifty pins of the flash memory card are occupied to either transfer data or provide control signals to and from the flash memory card, this improved flash memory card merely senses selected pins to determine the present mode of operation.

BRIEF DESCRIPTION OF THE DRAWINGS

FIG. 1A illustrates a perspective view of the preferred embodiment of the present invention.

FIG. 1B illustrates a bottom cutaway view of the preferred embodiment.

FIG. 1C illustrates a perspective inside view of the preferred embodiment.

DETAILED DESCRIPTION OF THE PREFERRED EMBODIMENT

Figure 2:
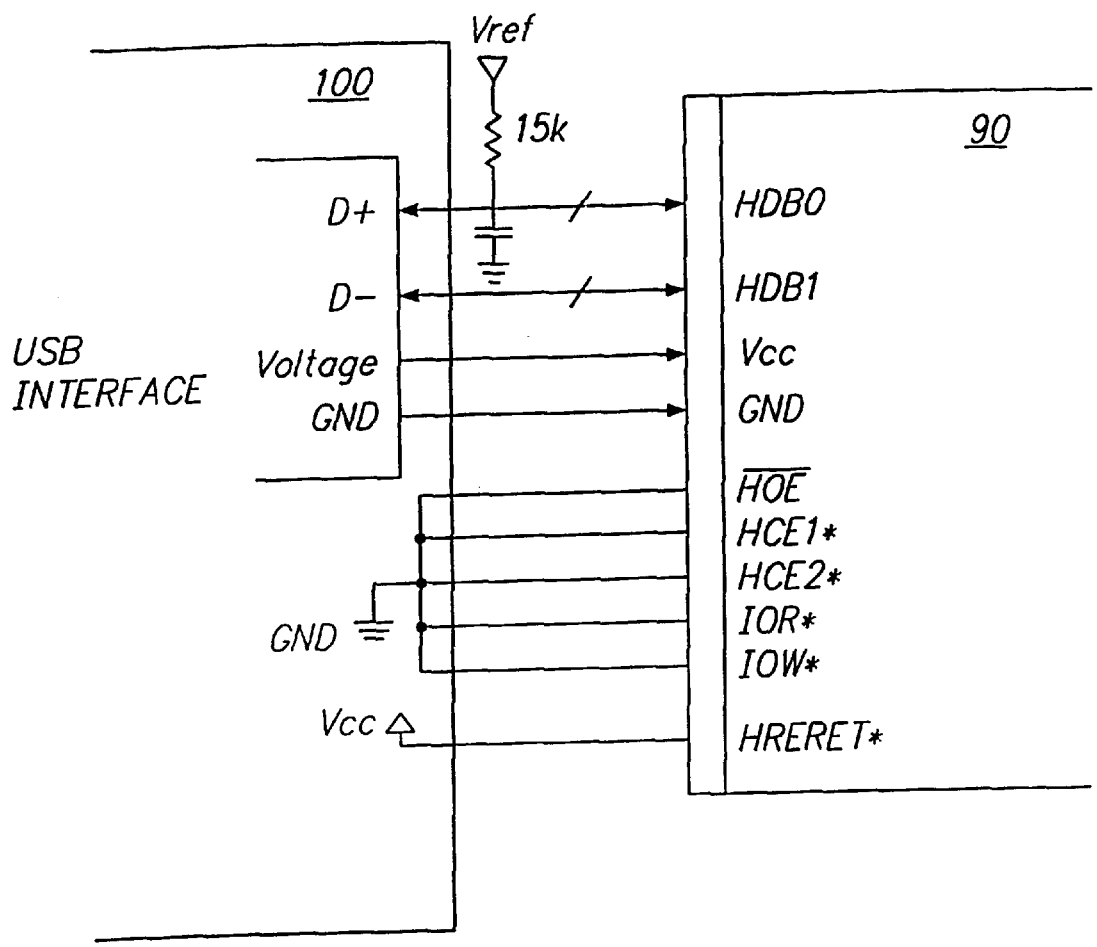
FIG. 2 illustrates a schematic diagram of the preferred embodiment.

The present invention relates to an improved compact flash memory card system. The present invention comprises an improved compact flash memory card with an internal controller and an improved flash memory card desktop interface. Upon initialization with an interface device, this improved compact flash memory card automatically detects which operation mode is used by this interface device and configures the memory card to be compatible with the present operation mode. For more efficient communication between the improved compact flash memory card and the computer, the improved desktop adapter utilizes a fifty pin socket to couple with the memory card and further adopts the universal serial bus architecture.

FIG. 1A illustrates a compact flash memory card system 10. This compact flash memory system 10 includes: a flash memory card desktop interface 100 and a compact flash memory card 90. The flash memory card desktop interface 100 preferably includes the following components: a housing 20, a card slot 30, a cable 40, a cable connector 45, and a plug 50. The housing 20 provides structure for the desktop interface 100. The housing is preferably made from a one piece molded housing such as plastic. The card slot 30 is preferably located through a top portion of the housing 20. The card slot 30 is configured to accommodate the compact flash memory card 90 sliding through the card slot 30. Preferably, the cable connector 45 securely attaches a first end of the cable 40 to the housing 20. The cable 40 is preferably a standard universal serial bus cable. The plug 50 is securely attached to a second end of the cable 40. The plug 50 is configured to easily couple with a universal serial bus on a computer.

FIG. 1B illustrates a bottom cutaway view of the housing 20 in the flash memory card desktop interface 100. An inside portion of the housing 20 has two pairs of fastener apertures 70. Each pair of fastener apertures 70 is configured to receive a weight 60. With the weight 60 attached to each pair of fastener apertures 70, the housing 20 preferably remains stable when resting on a surface. Further, there are also preferably two pairs of attachment points 80 inside the housing 20. The housing 20 also has an aperture 85 to preferably attach the cable connector 45 to the housing 20.

FIG. 1C illustrates a perspective cutaway view of the flash memory card desktop interface 100. A bottom plate 110 has two pairs of apertures 120 that preferably align with the two pairs of attachment points 80 located inside the housing 20. In use, the bottom plate 110 attaches to the bottom side of the housing 20 as illustrated in FIG. 1B. A card receiver housing 130 is preferably attached to the bottom plate 110. Additionally, a plurality of contact pins 160 are coupled to the card receiver housing 130. Preferably, there are fifty contact pins 160. The card receiver housing 130 is configured to receive and hold the compact flash memory card 90 as the memory card 90 is inserted through the slot opening 30 in the shell 20 as shown in FIG. 1A. Further, the plurality of contact pins 160 are configured to electrically couple with corresponding pins (not shown) on the memory card 90. The memory card 90 preferably has fifty pins (not shown) wherein each pin corresponds to one of the plurality of contact pins 160. A jumper 140 is coupled to the bottom plate 110. The jumper 140 provides a connection point between the cable 40 and the plurality of contact pins 160.

In use, the desktop interface 100 preferably couples a desktop computer (not shown) via the plug 50. The desktop interface is configured to receive and connect to the flash memory card 90 via a fifty pin connection. FIGS. 1A, 1B, and 1C and the description above illustrate and describe the preferred embodiment of the present invention. Eliminating and/or combining certain elements shown in the desktop interface 100 would be apparent to a person skilled in the art and would not depart from the scope of the present invention. For example, incorporating the weights 60 into the housing 20 would be apparent to a person skilled in the art.

FIG. 2 illustrates the connections between the flash memory card desktop interface 100 and the compact flash memory card 90 when they are coupled together. The compact flash memory card 90 utilizes fifty pins to connect with an interface device. A plurality of data input/output connections are made between D+ and D− terminals of the interface 100 and HDB0 and HDB1 terminals of the memory card 90, respectively. It is apparent to a person skilled in the art that other additional input/output pins are capable of being utilized between the memory card 90 and the desktop interface 100. Additionally, a VCC terminal and a $\overline{\text{HOSTRESET}}$ terminal of the memory card 90 correspond with a voltage terminal of the interface 100. Terminals $\overline{\text{HOE}}$, HCE1*, HCE2*, IOR*, IOW*, and GND of the memory card 90 correspond with a ground terminal of the interface 100.

Figure 3:
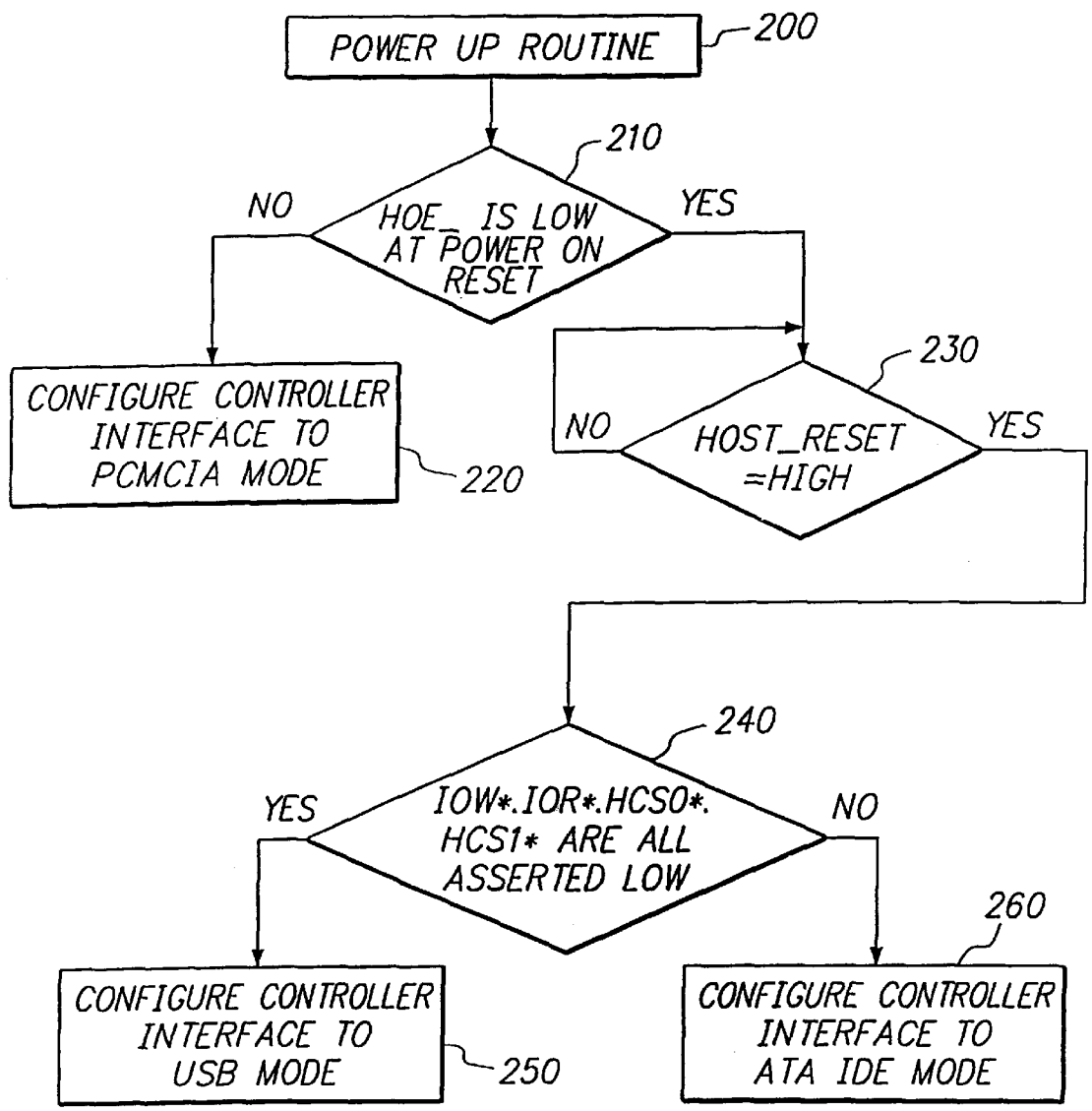
FIG. 3 shows a flowchart diagram of the preferred embodiment.

As stated above, the compact flash memory card 90 utilizes fifty pins which serve as input/output and control terminals for the memory card 90. All fifty pins of the memory card 90 are utilized to connect with the desktop computer. FIG. 3 illustrates a flowchart diagram which represents sample steps of an internal controller within the compact flash memory card 90 to determine the proper operating mode while using only the existing fifty pins of the memory card 90. This identification circuitry can be physically formed in the flash controller, or in an adapter module coupled between the compact flash memory card and the fifty pin socket. The controller does not alter or add any signals carried on the fifty pins of the memory card 90. Rather, it senses signals to determine the type of socket to which the compact flash memory card is attached.

After the memory card 90 is coupled to the interface 100, the first step occurs in Block 200 where the memory card 90 is powered up. After the power up sequence in Block 200, the signal at the $\overline{\text{HOE}}$ terminal of the memory card 90 is tested in Block 210. If the signal at the $\overline{\text{HOE}}$ terminal is high, then the internal controller configures the memory card 90 into the PCMCIA mode in Block 220. However, if the signal at the $\overline{\text{HOE}}$ terminal is low, then the signal at the $\overline{\text{HOSTRESET}}$ terminal is tested in Block 230. If the signal at the $\overline{\text{HOSTRESET}}$ terminal is low, then the internal controller returns to Block 230 and tests the signal at the $\overline{\text{HOSTRESET}}$ terminal again. If the signal at the $\overline{\text{HOSTRESET}}$ terminal remains low, then the internal controller continues to loop back to Block 230 until the $\overline{\text{HOSTRESET}}$ terminal switches to high. If the signal at the $\overline{\text{HOSTRESET}}$ terminal is high, then the internal controller moves to Block 240. In Block 240, the signals at terminals IOW*, IOR*, HCS0*, and HCS1* are tested. If all these signals are low, then the internal controller configures the memory card 90 into the universal serial bus mode in Block 250. If any of these signals are high, then the internal controller configures the memory card 90 into the ATA IDE mode in Block 260.

In use, this improved compact flash memory card 90 automatically detects which operation mode is used by the attached interface device and configures the memory card 90 to be compatible with the present operation mode. Based upon the set of responses shown in FIG. 3, the compact flash memory card 90 operates in either the universal serial bus mode, the PCMCIA mode, or the ATE IDE mode. These three operating modes are merely exemplary. The memory card 90 can be configured to automatically detect and operate in additional operating modes.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiments chosen for illustration without departing from the spirit and scope of the invention.

Specifically, it will be apparent to one of ordinary skill in the art that the device of the present invention could be implemented in several different ways and the apparatus disclosed above is only illustrative of the preferred embodiment of the invention and is in no way a limitation.

What is claimed is:

1. Means for interfacing a compact peripheral device with a host computer in an appropriate operating protocol mode selected from among a plurality of operating protocol modes, comprising a compact flash memory card external to the host computer, the compact flash memory card having a controller and a sensing means, the controller being operatively coupled to the sensing means, wherein the sensing means is capable of monitoring a plurality of signals distributed among a plurality of terminals, the plurality of signals originating from the host computer; and the controller is capable of automatically selecting the appropriate operating protocol mode in response to the plurality of signals.

2. A system for allowing an external peripheral device to automatically detect and configure the external peripheral device to utilize a correct operating protocol mode of a host computer selected from among a plurality of operating protocol modes, the system comprising:
   a. a flash memory card;
   b. a connector with a first end configured to couple to the host computer and a second end configured for coupling with the flash memory card;
   c. a controller embedded within the flash memory card capable of sensing and responding to a plurality of signals distributed among a plurality of terminals, the plurality of signals from the host computer and to operate the flash memory card in the correct operating protocol mode in response to the plurality of signals.

3. The system according to claim 2 wherein the connector is a PCMCIA connector.

4. The system according to claim 2 wherein the connector is a universal serial bus connector.

5. The system according to claim 2 wherein the connector is an ATA IDE connector.

6. A method of automatically configuring a peripheral device to operate with a host computer, comprising the following steps:
   a. externally coupling a flash memory card to the host computer such that the host computer communicates with the flash memory card;
   b. powering up the flash memory card;
   c. sensing a plurality of signals within the flash memory card wherein the plurality of signals are distributed among a plurality of terminals, and the plurality of signals originate from the host computer to determine an operating protocol mode of the host computer; and
   d. automatically configuring a correct operating protocol mode for the flash memory card in response to the plurality of signals.

7. The method according to claim 6 wherein the correct operating mode is a PCMCIA mode.

8. The method according to claim 6 wherein the correct operating mode is a universal serial bus mode.

9. The method according to claim 6 wherein the correct operating mode is a ATA IDE mode.

10. A system for attaching a peripheral device to a computer and configuring the peripheral device to a correct operating protocol mode selected from among a plurality of operating protocol modes, the system comprising:
    a. a flash memory card external to a computer;
    b. a connector with a first end configured to couple to the computer and a second end with a fifty pin connection configured to couple to the flash memory card; and
    b. a controller contained within the flash memory card capable of sensing a plurality of signals from the computer distributed among a plurality of terminals of the fifty pin connection, and to configure the flash memory card in the correct operating protocol mode in response to the plurality of signals.

11. An interface device comprising:
    a. a compact flash memory card external to a host computer which is capable of interfacing with the host computer in an appropriate protocol mode selected from among a plurality of protocol modes;
    b. sensing means within the compact flash memory card capable of monitoring a plurality of signals distributed among a plurality of terminals, the plurality of signals originating from the host computer; and
    c. a controller within the flash memory card, the controller coupled to the sensing means for automatically selecting an appropriate communication protocol mode from among a plurality of protocol modes in response to at least one signal originating from host computer.

12. The system of claim 2 wherein the appropriate operating protocol mode is a serial protocol.

13. The method in claim 6 wherein the step of coupling the peripheral device to the host computer is accomplished through use of a serial cable.

14. The interface device of claim 11 further comprising a serial cable for interfacing the flash memory card with the computer.

* * * * *

UNITED STATES PATENT AND TRADEMARK OFFICE
CERTIFICATE OF CORRECTION

PATENT NO. : 6,182,162 B1
DATED : January 30, 2001
INVENTOR(S) : Estakhri et al.

It is certified that error appears in the above-identified patent and that said Letters Patent is hereby corrected as shown below:

Claims,

Column 6,
Line 5, (Claim 6, element c.), after "an operating protocol mode" and before "of the host computer;", please add -- , selected from among a plurality of operating protocol modes, --.

Signed and Sealed this

Twenty-third Day of October, 2001

Attest:

*Nicholas P. Godici*

NICHOLAS P. GODICI
*Attesting Officer*     *Acting Director of the United States Patent and Trademark Office*